United States Patent [19]

Takeguchi et al.

[11] Patent Number: 5,116,440
[45] Date of Patent: May 26, 1992

[54] PROCESS FOR MANUFACTURING MULTILAYER PRINTED WIRING BOARD

[75] Inventors: Kazunori Takeguchi; Kohji Hirata, both of Amagasaki, Japan

[73] Assignee: Risho Kogyo Co., Ltd., Osaka, Japan

[21] Appl. No.: 475,945

[22] Filed: Feb. 6, 1990

[30] Foreign Application Priority Data

Aug. 9, 1989 [JP] Japan .................................. 1-207587
Sep. 12, 1989 [JP] Japan ............................ 1-106929[U]

[51] Int. Cl.$^5$ ............................................. B32B 31/20
[52] U.S. Cl. ...................................... 156/90; 156/289; 156/323; 174/259
[58] Field of Search ............... 156/289, 90, 323, 583.3, 156/581, 293; 100/211, 93 P; 174/259; 264/264, 320, 271.1

[56] References Cited

U.S. PATENT DOCUMENTS

| | | | |
|---|---|---|---|
| 3,840,424 | 10/1974 | Morrison | 156/293 X |
| 4,636,275 | 1/1987 | Norell | 156/289 |
| 4,680,075 | 7/1987 | McNeal et al. | 156/289 |
| 4,737,208 | 4/1988 | Bloechle et al. | 156/90 |

Primary Examiner—Jeff H. Aftergut
Attorney, Agent, or Firm—Wenderoth, Lind & Ponack

[57] ABSTRACT

In manufacturing multilayer printed wiring boards with a cavity for mounting an electronic device, a rubber or composite rubber sheet is mounted in the cavity to prevent a prepreg resin from flowing into the cavity. The rubber sheet or composite rubber sheet is removed after applying pressure and temperature to an assembly consisting of boards to be bonded and the prepreg between them. This eliminates poor bonding which can result when resin flows into the cavity.

10 Claims, 3 Drawing Sheets

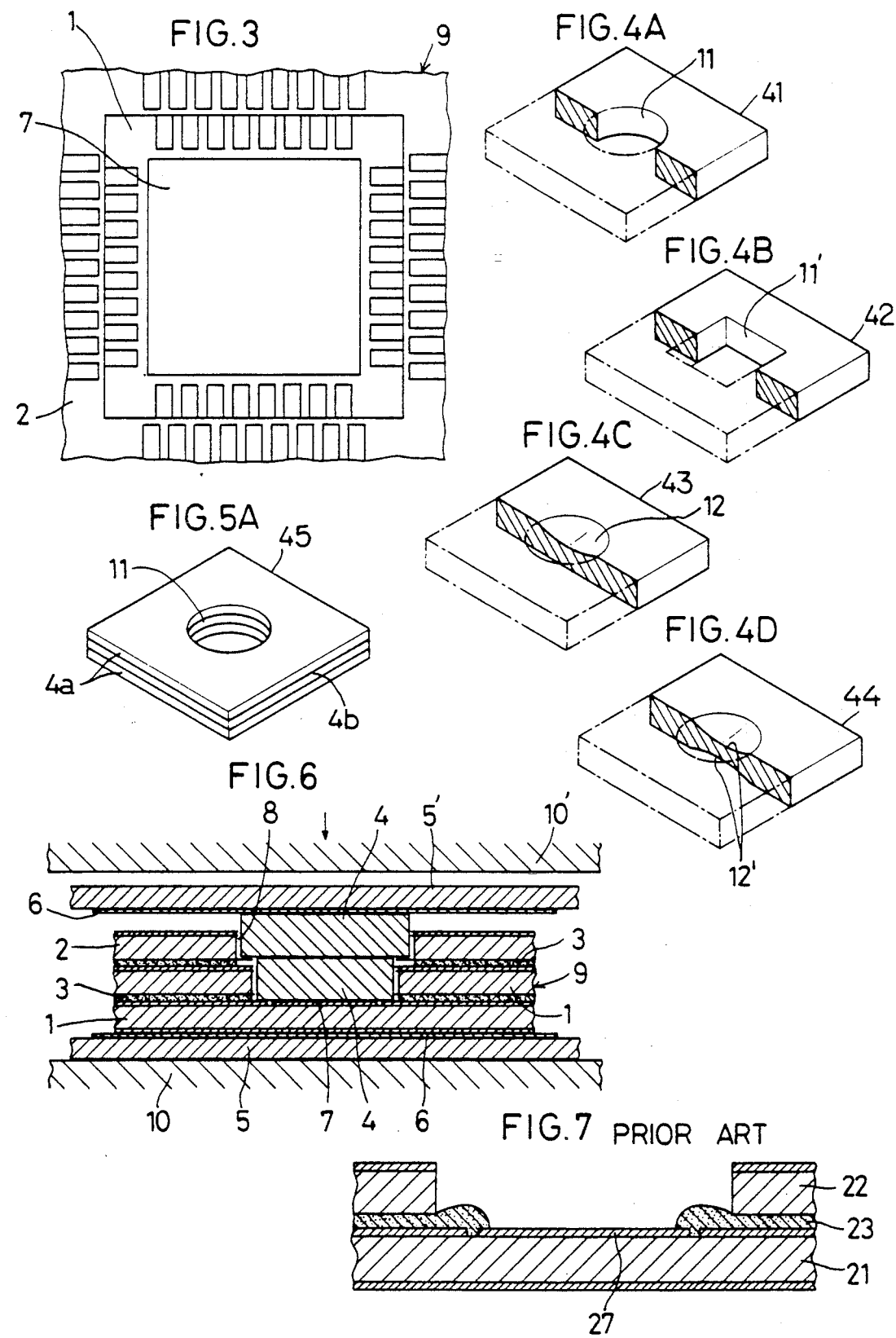

5,116,440

PROCESS FOR MANUFACTURING MULTILAYER PRINTED WIRING BOARD

BACKGROUND OF THE INVENTION

The present invention relates to a process for manufacturing a multilayer printed wiring board or package with a cavity for mounting an electronic device such as a semiconductor element.

In manufacturing such a wiring board, a process is known in which a copper clad laminate or printed wiring board (PWB) with a hole is bonded to a printed wiring board without a hole by use of a prepreg with a hole as a bonding layer. With the prepreg mounted between these two boards in alignment with them, heat and pressure are applied to the assembly to melt the prepreg and bond the two boards together.

The known process had a problem in that the prepreg made of resin tended to melt and flow into the cavity for mounting a semiconductor element so as to cover the bonding pads formed on the lower board. This results in poor bonding with the mounted semiconductor element and thus poor electrical conduction.

One solution to this problem is to use a prepreg of a low-flow or non-flow type to minimize the possibility of molten resin flowing into the cavity. But, this might form a void or discontinuity on the wiring board.

Another solution is to use a prepreg with a larger hole than that of the upper laminate or board. Although this can prevent the molten resin from flowing into the cavity, a sufficient rigidity can not be obtained for secure bonding due to the formation of a gap between the bonding pads and the laminate or board with a hole. This results in poor bonding between the bonding pads on the lower board (PWB) and the semiconductor element.

FIG. 7 shows how the bonding pads can become covered with molten resin of a prepreg 23 which has flowed into the cavity.

SUMMARY OF THE INVENTION

An object of the present invention is to provide an improved process for stably and easily manufacturing a multilayer printed wiring board for mounting an electronic device which prevents molten resin from flowing into the cavity.

In accordance with the present invention, a rubber sheet is mounted in the cavity to prevent molten resin from flowing into the cavity. The rubber sheet should have a slightly smaller size than the cavity and a slightly larger thickness than the depth of the cavity.

The rubber sheet should preferably be formed with a hole or recess for greater tolerance in its thickness.

Also, the rubber sheet should preferably be formed of a plurality of layers having different elastic moduli.

Due to the provision of the rubber sheet, molten resin from the prepreg will not flow into the cavity and cover the bonding pad. This ensures bonding with a semiconductor element and allows the use of a prepreg of a normal-flow type. Thus, a reliable multilayer printed wiring board with no void or discontinuity can be manufactured by employing this process.

Other objects and features of the present invention will become apparent from the following description taken with reference to the accompanying drawings, in which:

BRIEF DESCRIPTION OF THE DRAWINGS

FIG. 3 is a partial top view of the multilayer printed wiring board;

FIGS. 4A to 4D are perspective views of alternative embodiments of the rubber sheet;

FIGS. 5A and 5B are perspective views of further embodiments;

FIG. 6 is a view similar to FIG. 1C but including three boards; instead of two, bonded together, and FIG. 7 is a sectional view of a prior art multilayer printed wiring board.

DETAILED DESCRIPTION OF THE PREFERRED EMBODIMENT

Figure 1A:
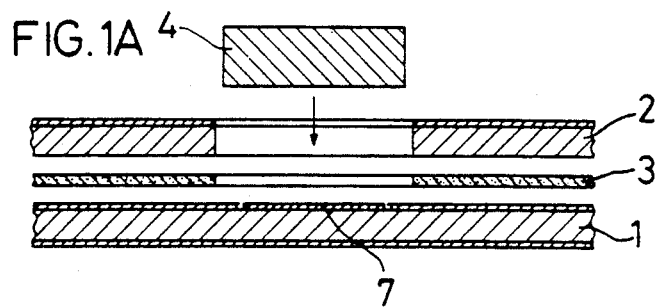
FIGS. 1A to 1C are sectional views showing how the multilayer printed wiring board is manufactured according to the present invention.
Figure 1B:
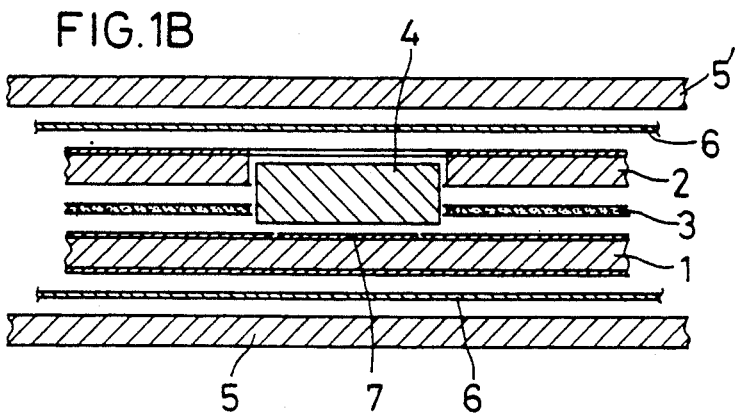
Figure 1C:
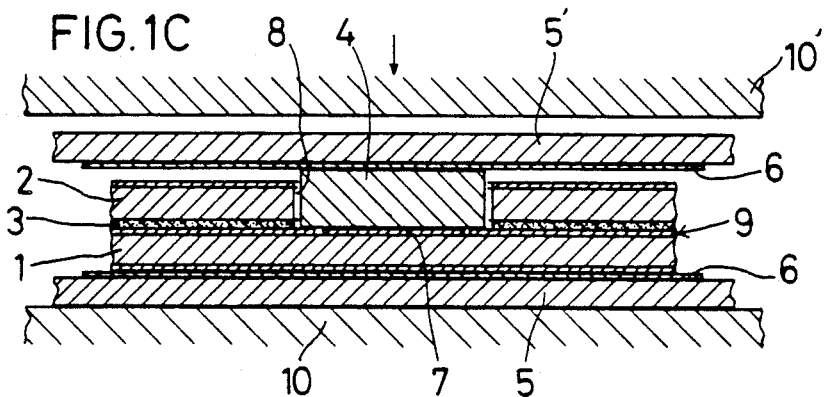

Referring to FIGS. 1A to 1C, a printed wiring board 1 (PWB) is put on a plate 5. The PWB 1 has one side thereof formed with a die pad 7 for mounting an electronic device and a circuit pattern containing bonding pads. A prepreg 3 formed with a square hole is put on the PWB 1 so that the hole will be aligned with the die pad 7 on the PWB 1. The prepreg 3 may be of a normal-flow type.

A copper clad laminate 2 having one side thereof clad with copper and formed with a hole is put on the prepreg 3 so that the hole will be aligned with the hole in the prepreg. Instead of a copper clad laminate, another PWB is bonded to the PWB 1 in some applications.

A cavity 8 is formed in the center of an assembly 9 thus formed to mount a semiconductor element thereon. A rubber sheet 4 having a slightly smaller size than that of the cavity 8 and a larger thickness than the depth of the cavity is mounted in the cavity 8.

Figure 2:
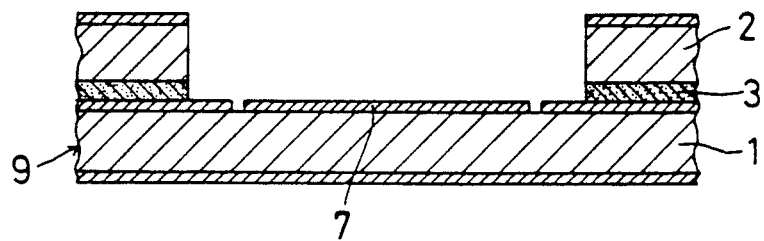
FIG. 2 is a sectional view of an assembly with no rubber sheet.

With the assembly sandwiched between a pair of release sheets 6, a pair of plates 5, 5' and a pair of hot plates 10, 10', heat and pressure are applied to the assembly 9. The prepreg 3 will melt by heat and bind the two boards 1, 2 together. The rubber sheet 4 is then removed. Now a multilayer printed wiring board is formed as shown in FIG. 2.

In experiments the distance which the molten resin flowed into the cavity was not more than 0.1 mm which is within acceptable limits and the distance which the rubber sheet extended into between the two boards 1 and 2 was less 0.1 mm which is also within acceptable limits.

The rubber sheet may be of any kind of rubber so long as it has a suitable elasticity, heat resistance and peelableness, but silicone rubber is the most preferable.

The rubber sheet 4 should have a size 0.1 to 2.0 mm smaller than the size of the cavity 8 and have a thickness 0.03 to 0.3 mm larger than the depth of the cavity.

When the prepreg 3 melts and binds the two boards 1 and 2 together, the rubber sheet 4 serves to prevent the molten resin from flowing into the cavity 8 and covering the bonding pad. This allows the use of a normal-flow prepreg instead of a non-flow or low-flow prepreg.

As shown in FIGS. 4A–4D, the rubber sheet 4 should preferably be formed with a hole or a recess. The use of such a rubber sheet with a hole or recess increases the acceptable range of thickness of the rubber sheet. In other words, a rubber sheet of a given size can be used for a wider range.

The rubber sheet of FIG. 4A has a round hole 11; that of FIG. 4B has a square hole 11'; that of FIG. 4C has a recess 12 in one side thereof; and that of FIG. 4D has recesses 12 in both sides thereof.

Figure 5B:
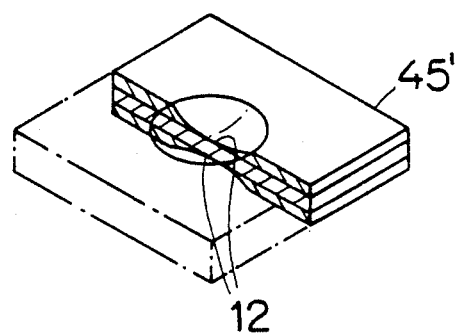

As shown in FIGS. 5A and 5B, a composite rubber sheet 45 or 45' can be provided and is preferably comprised of a plurality of layers having different elastic moduli. FIGS. 5A and 5B show the composite rubber sheet 45 or 45' having three layers, namely a middle layer 4b of a high elastic modulus and a pair of outer layers 4a of lower elastic modulus. The outer layers may be of e.g. silicone rubber and the middle layer 4b is of PET (polyethylene terephthalate).

When the assembly 9 including two boards 1 and 2, a prepreg 3 and the composite rubber sheet 45 or 45' is subjected to heat and pressure, the prepreg will be firstly pressed under pressure and then the composite rubber sheet 45, 45' will also be pressed. Thereafter, heat will be transmitted to the prepreg 3 until it reaches its melting point. The prepreg resin will soften and its viscosity will decrease. Because pressure is still acting on the prepreg 3, the resin tends to flow toward the cavity 8. Since the pressure to the composite rubber sheet 45, 45' acts on its silicone rubber layers 4a in a direction perpendicular to its thickness, the resin is prevented by the composite rubber sheet 45, 45' from flowing toward the cavity.

In this state, the resin will thermoset. The composite rubber sheet 45, 45' is then removed. This makes it possible to manufacture a printed wiring board with no flow of resin into the cavity.

Although the foregoing description is based on a wiring board having two boards, a multilayer printed wiring board having three or more boards bonded together can be manufactured in a similar manner as above, as shown in FIG. 6, in which one copper clad laminate 2 and one printed wiring board 1 are bonded to another printed wiring board.

What is claimed is:

1. A process for manufacturing a multilayer printed wiring board for mounting an electronic device, comprising the steps of putting a prepreg with a hole on a printed wiring board, putting a copper clad laminate with a hole or a second printed wiring board with a hole on said prepreg so that the hole in said prepreg will be in alignment with the hole in said laminate or said second printed wiring board to form a cavity, mounting a rubber or composite rubber sheet in said cavity to form an assembly, applying heat and pressure to said assembly to melt said prepreg and bond said laminate or said second printed wiring board with said printed wiring board, and removing said rubber or composite rubber sheet, wherein said rubber or composite rubber sheet has a smaller size than said cavity and a larger thickness than the depth of said cavity, wherein said rubber or composite rubber sheet is elastic, and wherein said rubber or composite rubber sheet has a plurality of layers, at least two of said layers having different elastic moduli.

2. A process as claimed in claim 1, wherein said rubber or composite rubber sheet is formed with a hole.

3. A process as claimed in claim 1, wherein said rubber or composite rubber sheet is formed with a recess.

4. A process for manufacturing a multilayer printed wiring board for mounting an electronic device, comprising the steps of putting a prepreg with a hole on a printed wiring board, putting a copper clad laminate with a hole or a second printed wiring board with a hole on said prepreg so that the hole in said prepreg will be in alignment with the hole in said laminate or said second printed wiring board to form a cavity, mounting a rubber or composite rubber sheet in said cavity to form an assembly, applying heat and pressure to said assembly to melt said prepreg and bond said laminate or said second printed wiring board with said printed wiring board, and removing said rubber or composite rubber sheet, wherein said rubber or composite rubber sheet has a plurality of layers, at least two of said layers having different elastic moduli.

5. A process as claimed in claim 4, wherein said rubber or composite rubber sheet is formed with a hole.

6. A process as claimed in claim 4, wherein said rubber or composite rubber sheet is formed with a recess.

7. A process for manufacturing a multilayer printed wiring board for mounting an electronic device, comprising the steps of putting a prepreg with a hole on a printed wiring board, putting a copper clad laminate with a hole or a second printed wiring board with a hole on said prepreg so that the hole in said prepreg will be in alignment with the hole in said laminate or said second printed wiring board to form a cavity, mounting a rubber or composite rubber sheet in said cavity to form an assembly, applying heat and pressure to said assembly to melt said prepreg and bond said laminate or said second printed wiring board with said printed wiring board, and removing said rubber or composite rubber sheet, wherein said rubber or composite rubber sheet is formed with a hole.

8. A process for manufacturing a multilayer printed wiring board for mounting an electronic device, comprising the steps of putting a prepreg with a hole on a printed wiring board, putting a copper clad laminate with a hole or a second printed wiring board with a hole on said prepreg so that the hole in said prepreg will be in alignment with the hole in said laminate or said second printed wiring board to form a cavity, mounting a rubber or composite rubber sheet in said cavity to form an assembly, applying heat and pressure to said assembly to melt said prepreg and bond said laminate or said second printed wiring board with said printed wiring board, and removing said rubber or composite rubber sheet, wherein said rubber or composite rubber sheet is formed with a recess.

9. A process for manufacturing a multilayer printed wiring board for mounting an electronic device, comprising the steps of putting a prepreg with a hole on a printed wiring board, putting a copper clad laminate with a hole or a second printed wiring board with a hole on said prepreg so that the hole in said prepreg will be in alignment with the hole in said laminate or said second printed wiring board to form a cavity, mounting a rubber or composite rubber sheet in said cavity to form an assembly, applying heat and pressure to said assembly to melt said prepreg and bond said laminate or said second printed wiring board with said printed wiring board, and removing said rubber or composite rubber sheet, wherein said rubber or composite rubber sheet has a smaller size than said cavity and a larger thickness than the depth of said cavity, wherein said rubber or composite rubber sheet is elastic, and wherein said rubber or composite rubber sheet is formed with a hole.

10. A process for manufacturing a multilayer printed wiring board for mounting an electronic device, comprising the steps of putting a prepreg with a hole on a printed wiring board, putting a copper clad laminate with a hole or a second printed wiring board with a hole on said prepreg so that the hole in said prepreg will be in alignment with the hole in said laminate or said second printed wiring board to form a cavity, mounting a rubber or composite rubber sheet in said cavity to form an assembly, applying heat and pressure to said assembly to melt said prepreg and bond said laminate or said second printed wiring board with said printed wiring board, and removing said rubber or composite rubber sheet, wherein said rubber or composite rubber sheet has a smaller size than said cavity and a larger thickness than the depth of said cavity, wherein said rubber or composite rubber sheet is elastic, and wherein said rubber or composite rubber sheet is formed with a recess.

* * * * *